(12) United States Patent
Shirashige et al.

(10) Patent No.: US 6,262,878 B1
(45) Date of Patent: Jul. 17, 2001

(54) CHIP CAPACITOR

(75) Inventors: Michihiro Shirashige, Hyogo-ken; Hidemasa Ichiki, Suita; Koichi Baba, Higashiosaka; Kazuto Okada, Hyogo-ken; Takayoshi Oka, Suita, all of (JP)

(73) Assignee: Matsuo Electric Company Limited, Osaka-fu (JP)

(*) Notice: Subject to any disclaimer, the term of this patent is extended or adjusted under 35 U.S.C. 154(b) by 0 days.

(21) Appl. No.: 09/594,369

(22) Filed: Jun. 15, 2000

(30) Foreign Application Priority Data

Jun. 18, 1999 (JP) .................................. 11-172739

(51) Int. Cl.$^7$ ....................................... H01G 9/04
(52) U.S. Cl. .................... 361/508; 361/523; 361/528
(58) Field of Search .......................... 361/508, 523, 361/528, 532, 535, 540, 529, 524

(56) References Cited

U.S. PATENT DOCUMENTS 4,539,623 * 9/1985 Irikura et al. ..................... 361/433
5,390,074 * 2/1995 Hasegawa et al. ................. 361/540
5,629,830 * 5/1997 Yamagami et al. ................. 361/535
5,926,363 * 7/1999 Kuriyama ........................... 361/523

FOREIGN PATENT DOCUMENTS 55-47449 B2 11/1980 (JP) .
1-29050 B2 6/1989 (JP) .

* cited by examiner

Primary Examiner—Dean A. Reichard
Assistant Examiner—Nguyen T Ha
(74) Attorney, Agent, or Firm—Duane, Morris & Heckscher LLP

(57) ABSTRACT

A capacitor element has on its outer surface a cathode layer with a flat bottom surface, and also a tantalum lead extending outward from its one end. One of opposing major surfaces of a flat cathode terminal is located beneath and in parallel with the bottom surface of the cathode layer. They are electrically connected with each other. One of opposing major surfaces of a flat anode terminal is located substantially in the same plane as the one major surface of the cathode terminal and is electrically connected to the tantalum lead of the capacitor element. The capacitor element, the anode terminal and the cathode terminal are encapsulated with portions of the other major surfaces of the cathode and anode terminals left exposed.

7 Claims, 9 Drawing Sheets

CHIP CAPACITOR

This invention relates to a small chip capacitor mounted on, for example, a printed circuit board.

BACKGROUND OF THE INVENTION

An example of prior art chip capacitors is shown in FIG. 1. The chip capacitor shown in FIG. 1 includes a solid-state tantalum capacitor element 2 with a cathode layer 4 disposed on its outer surface. An anode lead 6 is led out from one end surface of the capacitor element 2. A flat cathode terminal 8 is connected to the cathode layer 4 with an electrically conductive adhesive (not shown). Also, a flat anode terminal 10 is welded to the tip end of the anode lead 6. An encapsulation 12 is provided by transfer molding with epoxy resin. Outer end portions of the flat anode and cathode terminals 10 and 8 are bent to extend along the end surfaces of the encapsulation 12 and, then, further bent to extend along the bottom surface of the encapsulation 12.

It is seen that a large proportion of the cathode terminal 8 is within the encapsulation 12, and the proportion of the volume occupied by the cathode terminal 8 to the entire volume of the encapsulation 12 is large. Further, both the cathode terminal 8 and the anode terminal 10 include portions extending on the side surfaces of the encapsulation 12. Accordingly, the length of the capacitor is increased by the thickness of these portions. In mounting such chip capacitor on a printed circuit board, the side surfaces of the cathode and anode terminals 8 and 10 are connected to the board by solder 14. Accordingly, when a number of such chip capacitors are to be mounted on a board side by side, as shown in FIG. 2, the spacing between adjacent chip capacitors must be large enough to prevent short-circuiting of adjacent capacitors, which prevents dense packing of the capacitors. Recently, smallsized, portable electric and electronic devices, such as cellular phones, have been remarkably improved, and chip capacitors to be used in such devices are required to be down-sized. For down-sizing prior art chip capacitors like the ones described above, the volume occupied by the capacitor element 2 in the chip capacitor including the encapsulation 12 should be as small as possible, which sometimes prevents the chip capacitor from having desired capacitance.

Therefore an object of the present invention is to provide a chip capacitor which makes high density packing possible, and can have desired capacitance, while being small in size.

SUMMARY OF THE INVENTION

A chip capacitor according to the present invention includes a capacitor element, which has a cathode layer formed on its outer surface. The cathode layer has at least one surface thereof flattened. An anode lead extends from one end of the capacitor element. The anode lead may be pillar-shaped, e.g. cylinder-shaped or prism-shaped, or may be flat, e.g. plate-shaped or foil-shaped.

A flat cathode terminal is electrically connected to the cathode layer. The cathode terminal has first and second opposite major surfaces. The first major surface of the flat cathode terminal is located in a plane below and in parallel with the flat surface of the cathode layer. The first major surface of the cathode terminal is electrically connected to the flat surface of the cathode layer on the capacitor element.

A flat anode terminal having first and second opposite major surfaces is connected to the anode lead of the capacitor element. The first major surface of the anode terminal lies in substantially the same plane as the first major surface of the cathode terminal. The second major surface of the anode terminal is electrically connected to the anode lead of the capacitor element. The capacitor elements with the cathode layer and the anode lead, and the cathode and anode terminals are coated with or encapsulated in, for example, a plastic resin with at least portions of the second major surfaces of the cathode and anode terminals left exposed.

The exposed portions of the second surfaces of the cathode and anode terminals may be provided with regions set back toward their respective first surfaces.

The outer edge of the cathode terminal may be located in the vicinity of the end of the capacitor element opposite to the one end from which the anode lead extends.

The anode terminal may have its outer edge located in the vicinity of the tip end of the anode lead, and have its inner edge located beneath the flat surface of the cathode layer, being insulated therefrom.

The anode terminal may have a raised portion which can contact with the anode lead. The raised portion and the anode lead are electrically connected with each other.

The anode lead may extend out from the capacitor element at a location near the flat surface of the cathode layer so as to enable direct connection of the anode lead to the anode terminal.

The anode lead may be electrically connected to the anode terminal by a connector. The connector has an anode-lead contacting portion contacting the upper portion of the anode lead, legs extending from opposite ends of the anode-lead contacting portion toward the anode terminal, and feet disposed at the distal ends of the legs to contact the anode terminal, when the connector is positioned in place. The anode lead and the anode-lead contacting portion are electrically connected with each other, and the feet are electrically connected to the anode terminal.

BRIEF DESCRIPTION OF THE INVENTION

FIG. 1 a is cross-sectional view of a prior art chip capacitor.

DETAILED DESCRIPTION OF EMBODIMENT OF THE INVENTION

Figure 3A:
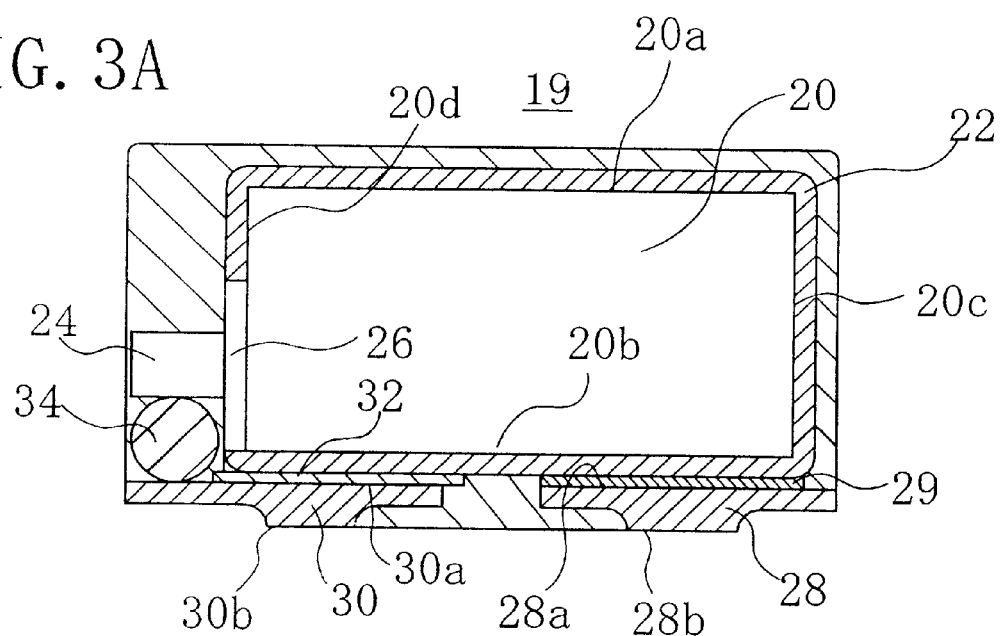
FIG. 3A is a cross-sectional view of a chip capacitor according to one embodiment of the present invention.
Figure 3B:
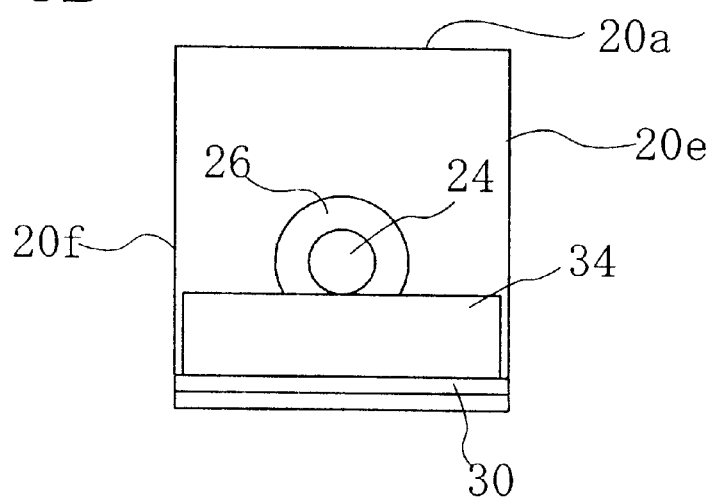
FIG. 3B is a front view of the chip capacitor shown in FIG. 3A with an encapsulation and a cathode layer removed.

A chip capacitor 19 according to one embodiment of the present invention is shown in FIGS. 3A and 3B. The chip capacitor 19 may be a chip-type tantalum capacitor. As shown in FIG. 3A, the capacitor 19 includes a capacitor element 20, which may be of a rectangular parallelepiped shape. The capacitor element 20 has a top surface 20a, a bottom surface 20b, end surfaces 20c and 20d, and side surfaces 20e and 20f. The shape of the capacitor element can be of other than a rectangular parallelepiped provided that at least one of the surfaces, e.g. the bottom surface 20b, is flat. Thus, it may have a shape of semi-cylinder.

A cathode layer 22 is disposed on substantially entire outer surface of the capacitor element 20. An anode lead 24 of, for example, tantalum extends out from the end surface 20d of the capacitor element 20. Further, in order to prevent the cathode layer from being formed around the portion from which the anode lead 24 extends, a washer-like member 26 is disposed on the end surface 20d of the capacitor element 20, through which the anode lead 24 extends. The tantalum anode lead 24 has a columnar shape, but it may be flat. The capacitor element 2 can be prepared by a known process.

At a location beneath the bottom surface 20b of the capacitor element and near the end surface 20c, a cathode terminal 28 is disposed. The cathode terminal 28 may be a rectangular, flat plate-like member with two opposing parallel major surfaces 28a and 28b. The outer edge of the cathode terminal 28 is located near the end surface 20c of the capacitor element 20. For example, it may be at a location slightly outward of the end surface 20c. The inner edge of the cathode terminal 28 is at a location slightly offset toward the end surface 20c from the longitudinal center, i.e. the midpoint between the end surfaces 20c and 20d, of the bottom surface 20b of the capacitor element 20. The major surface 28a of the cathode terminal 28 is located near and in parallel with the bottom surface 20b of the capacitor element 20. The major surface 28a of the cathode terminal 28 is electrically and mechanically connected to the cathode layer 22 by an electrically conductive adhesive layer 29.

The cathode terminal 28 is thinned from the major surface 28b toward the surface 28a in its outer and inner end portions, whereby a downward mesa-like portion is formed. The major surface 28b may be kept flat instead.

An anode terminal 30 is disposed beneath the portion of the bottom surface 20b of the capacitor element 20 closer to the end surface 20d. The anode terminal 30 may be a rectangular flat plate-like member having opposite two major surfaces 30a and 30b. The outer edge of the anode terminal 30 is located near the tip end of the tantalum lead 24. For example, it may be located slightly outward of the tip end of the tantalum lead 24. The inner edge of the anode terminal 30 is located, being slightly offset toward the end surface 20d of the capacitor element 20 from the longitudinal center of the bottom surface 20b of the capacitor element 20. The inner edge of the anode terminal 30 is spaced from the inner edge of the cathode terminal 28 by a predetermined distance.

The major surface 30a of the anode terminal 30 is substantially in the same plane as the major surface 28a of the cathode terminal 28. In order to prevent the portion of the major surface 30a of the anode terminal 30 located beneath the cathode layer 22 from contacting with the cathode layer 22, an insulator, e.g. an insulating tape 32, is disposed between them. The inner and outer end portions of the major surface 30b of the anode terminal 30 are set back toward the major surface 30a so that a mesa-like portion similar to the one in the surface 28b of the cathode terminal 28 can be formed, although it may be left flat without such mesa-like portion.

The anode terminal 30 and the tantalum lead 24 are electrically connected with each other by means of a connector, e.g. a tantalum wire 34. As shown in FIG. 3B, which is a front view of the chip capacitor with a later-mentioned resin encapsulation 36 and the cathode layer 22 removed, the tantalum wire 34 has a length approximately equal to the width of the capacitor element 20 (i.e. the dimension between the side surfaces 20e and 20f). For example, the tantalum wire 34 may be of a column-shaped and have a length slightly smaller than the width of the capacitor element 20. The tantalum wire 34 is disposed to extend along the width of the capacitor element 20. It is disposed on the major surface 30a of the anode terminal 30 beneath the tantalum lead 24. The tantalum wire 34 is in contact with and mechanically and electrically connected to both the tantalum lead 24 and the major surface 30a of the anode terminal 30 by welding.

The capacitor element 20, the tantalum wire 34, the cathode terminal 28 and the anode terminal 30 are coated or encapsulated in a resin, e.g. epoxy resin. The epoxy resin forms the encapsulation 36. It should be noted that although the inner edges and their vicinities of the major surfaces 28b and 30b of the cathode and anode terminals 28 and 30 are covered with the encapsulation resin 36, the remaining portions of the major surfaces 28b and 30b are not covered with the resin but left exposed, as shown in FIG. 3A.

Figure 1:
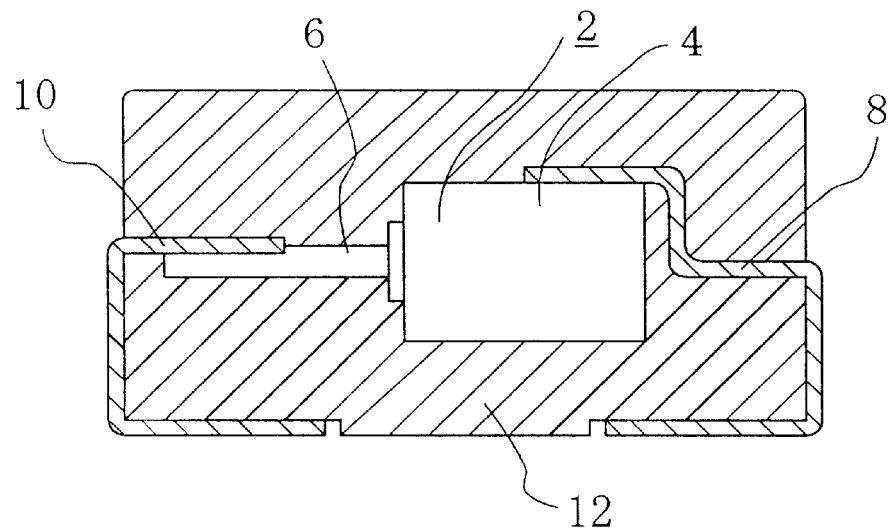
Figure 2:
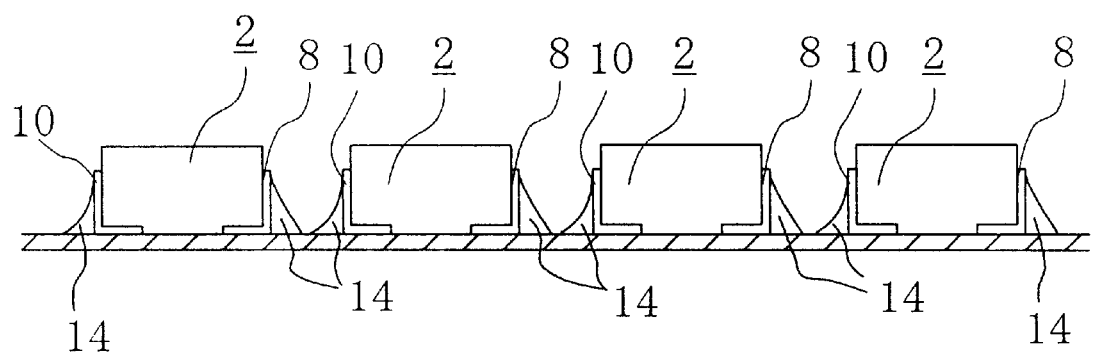
FIG. 2 illustrates how chip capacitors shown in FIG. 1 are mounted on a printed circuit board.

The cathode terminal 28 is connected to the cathode layer 22 only in the region beneath the bottom surface 20b of the capacitor element 20. Accordingly, different from the prior art chip capacitor shown in FIG. 1, the cathode terminal 28 neither rises up along the end surface of the capacitor nor extends through the encapsulation, which allows the use of a small encapsulation. In addition, since the outer edge of the cathode terminal 28 extends only to a point near the end surface 20c of the capacitor element 20, the length dimension of the encapsulation 36 can be further reduced.

Similarly, the anode terminal 30 lies only beneath the bottom surface 20a of the capacitor element 20, and its outer edge is located in the vicinity of the tip end of the tantalum lead 24. Accordingly, the encapsulation 36 can be smaller than the one of the prior art. Thus, the proportion of the volume of the encapsulation 36 to the volume of the entire chip tantalum capacitor 19 can be smaller.

Furthermore, since the inner end of the anode terminal 30 extends not only beneath the tantalum lead 24 but also beneath a portion of the bottom surface 20b of the capacitor element 20, an area sufficient to provide reliable soldering of the anode terminal 30 to a printed circuit board can be secured on the anode terminal 30.

Since the cathode and anode terminals 28 and 30 lie only beneath the capacitor element 20, the chip capacitor as a whole can be smaller in size, or larger capacitance than prior art capacitor of the same size can be realized.

Figure 4:
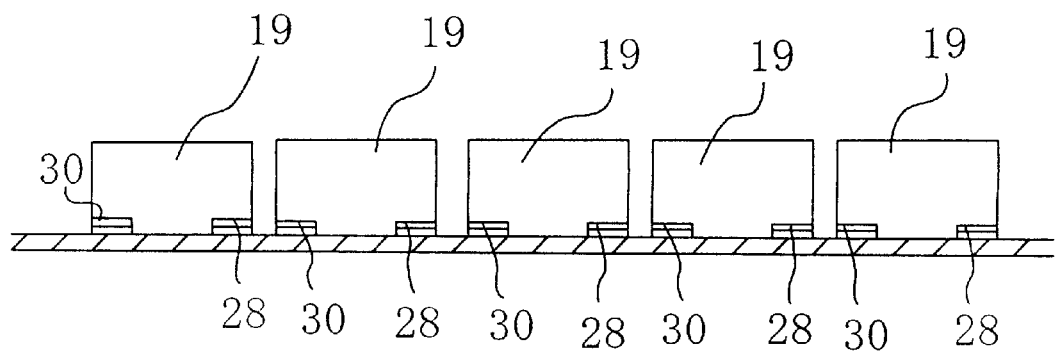
FIG. 4 illustrates how the chip capacitors shown in FIGS. 3A and 3B are mounted on a printed circuit board.

Furthermore, neither the cathode terminal 28 nor the anode terminal 30 extends on the end surface of the encapsulation 36. Accordingly, if a plurality of such tantalum chip capacitors 19 are mounted on a printed circuit board, no solder need be applied to the end surfaces of the capacitors 19, as shown in FIG. 4. Therefore the capacitors 19 can be spaced by a smaller distance from adjacent ones. This means that even if the capacitors 19 had the same size as prior art capacitors, a higher packing density can be realized. However, since the size of each capacitor 19 is smaller than prior art capacitors of the same capacitance, a much higher packing density can be realized.

Furthermore, portions of the major surfaces 28b and 30b of the cathode and anode terminals 28 and 30 set back toward the opposite major surfaces 28a and 30a can receive an excess quantity of solder used for soldering the terminals 28 and 30 to the printed circuit board, whereby a uniform thickness of solder layer can be formed. Accordingly, the capacitor 19 can be fixed to the board securely.

The tantalum chip capacitor 19 may be manufactured in the following process, for example.

Figure 5:
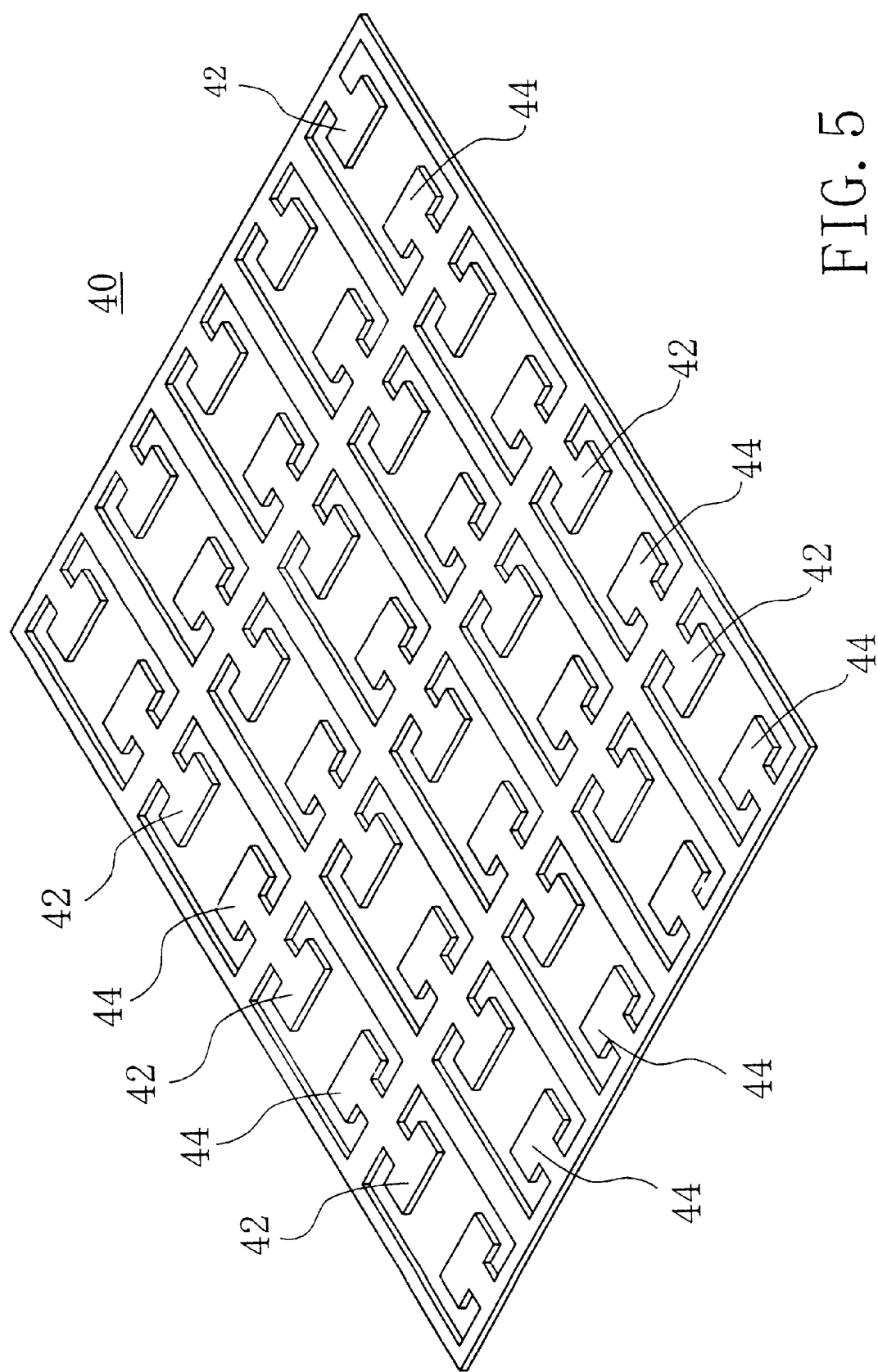
FIG. 5 is a perspective view of a terminal frame for use in manufacturing a plurality of chip capacitors shown in FIGS. 3A and 3B.

First, a terminal frame 40 is prepared as shown in FIG. 5. the terminal frame 40 includes a matrix of a plurality of cathode and anode terminal sections 42 and 44, which ultimately become the cathode and anode terminals 28 and 30 of resulting capacitors. The cathode and anode terminal sections 42 and 44 are formed in pairs, with the cathode and anode terminals 42 and 44 in each pair face with each other and located in the same plane.

Figure 6:
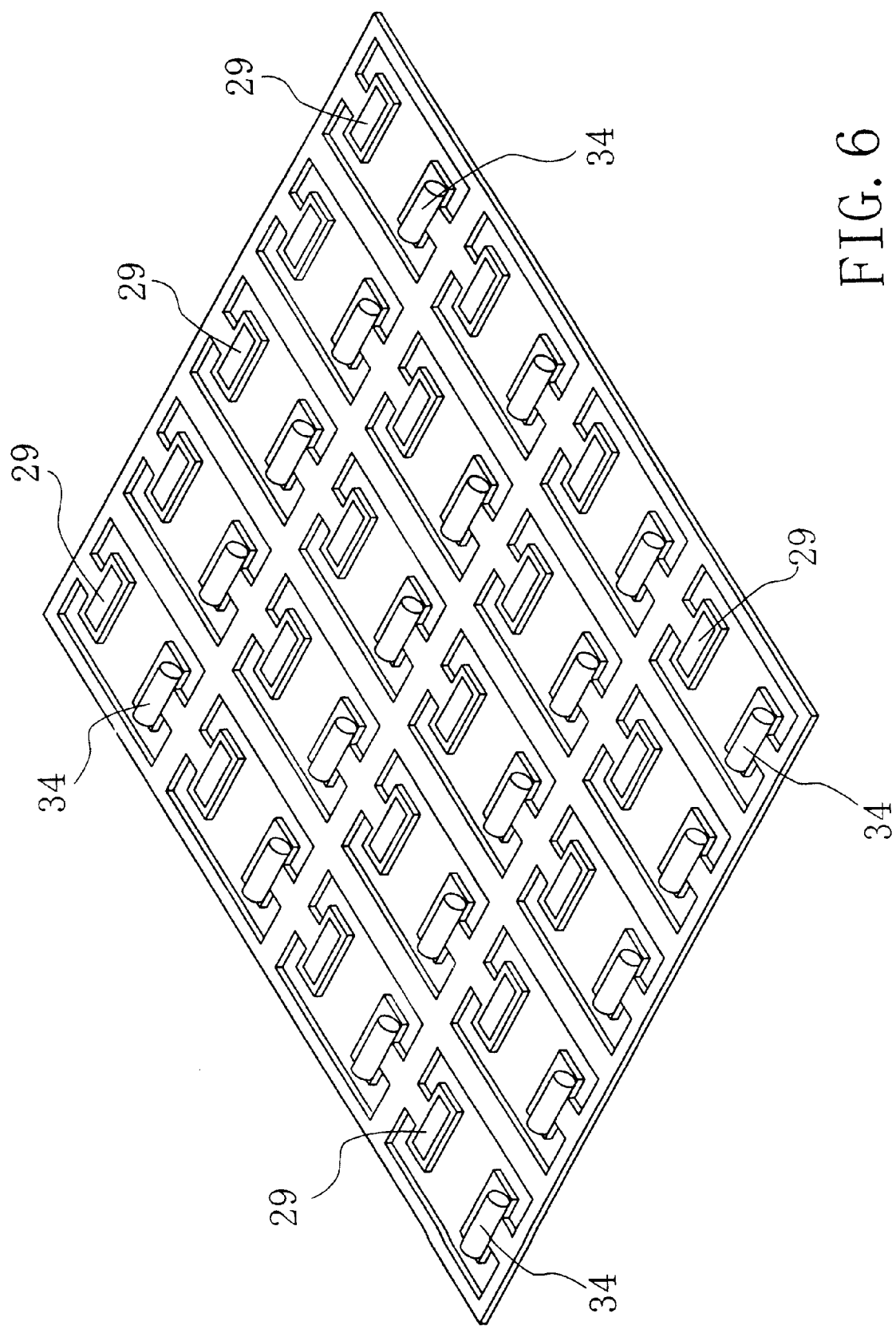
FIG. 6 is a perspective view of the terminal frame shown in FIG. 5, with tantalum wires and electrically conductive adhesive layers disposed thereon.

Then, the insulating tape 32 (FIG. 3A) is placed to adhere to that portion of the upper surface of each anode terminal 44 which is closer to the associated cathode terminal section 42. After that, the tantalum lead 34 is directly placed on and welded to the upper surface of each anode electrode section 44, and a quantity of the electrically conductive adhesive 29 is printed on or applied over each cathode terminal section 42 in the region nearer to the associated anode terminal section 44, as shown in FIG. 6.

In place of the insulating tapes 32, patches of insulating ink may be printed.

Figure 7:
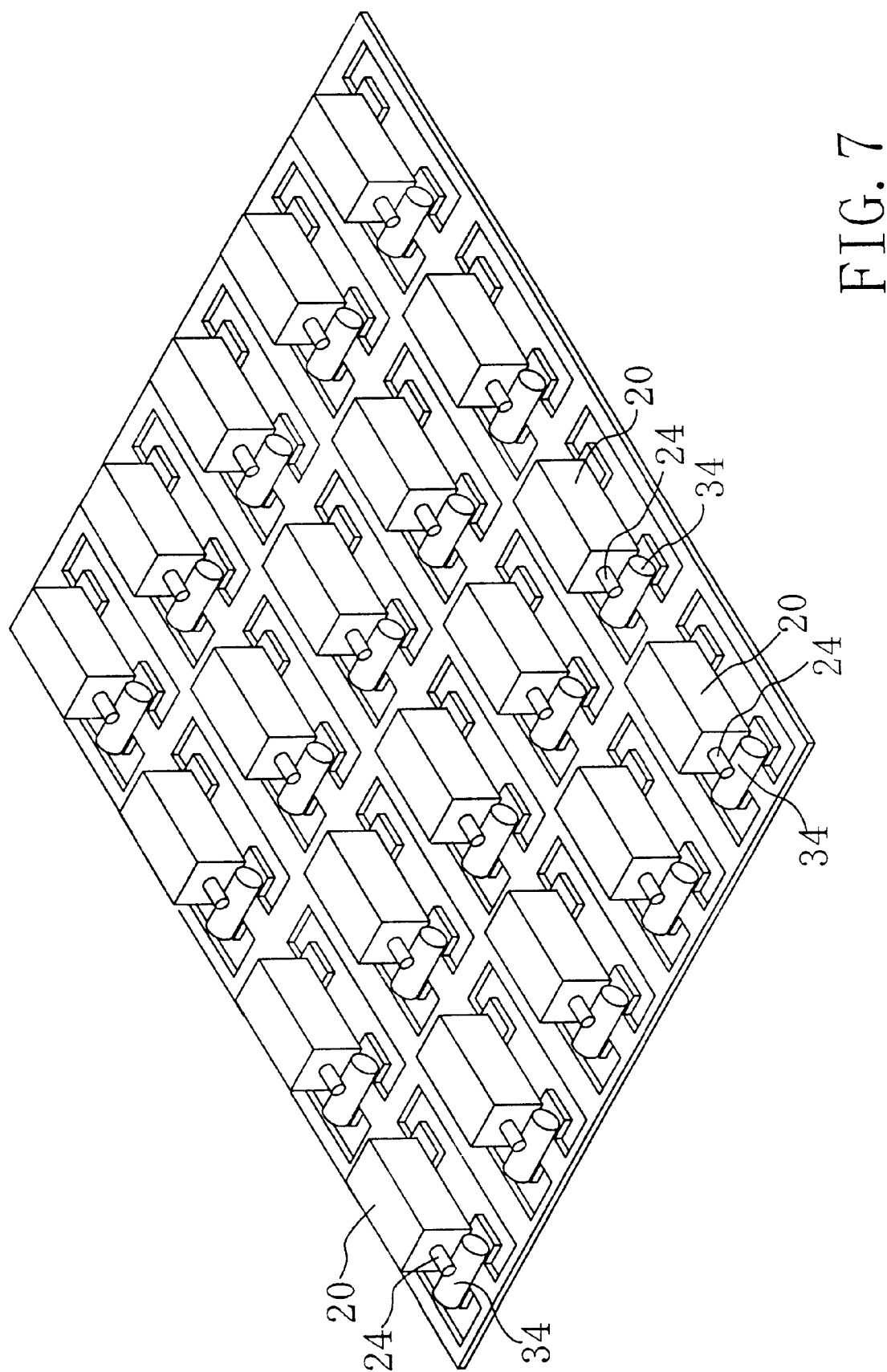
FIG. 7 is a perspective view of the terminal frame shown in FIG. 6, with capacitor elements disposed thereon.

Then, as shown in FIG. 7, separately prepared capacitor elements 20 are placed in such a manner that the tantalum lead 24 of each capacitor element 20 is brought into contact with the tantalum wire 34 on one of the anode terminal sections 44, with the bottom surface of the cathode layer 22 of that capacitor element 20 contacting the conductive adhesive 29 on the associated cathode terminal section 42. Thus, the cathode layers 22 of the capacitor elements 20 are bonded to the respective cathode terminal sections 44. After that, the tantalum leads 24 and the associated tantalum wires 34 are welded together.

Figure 8:
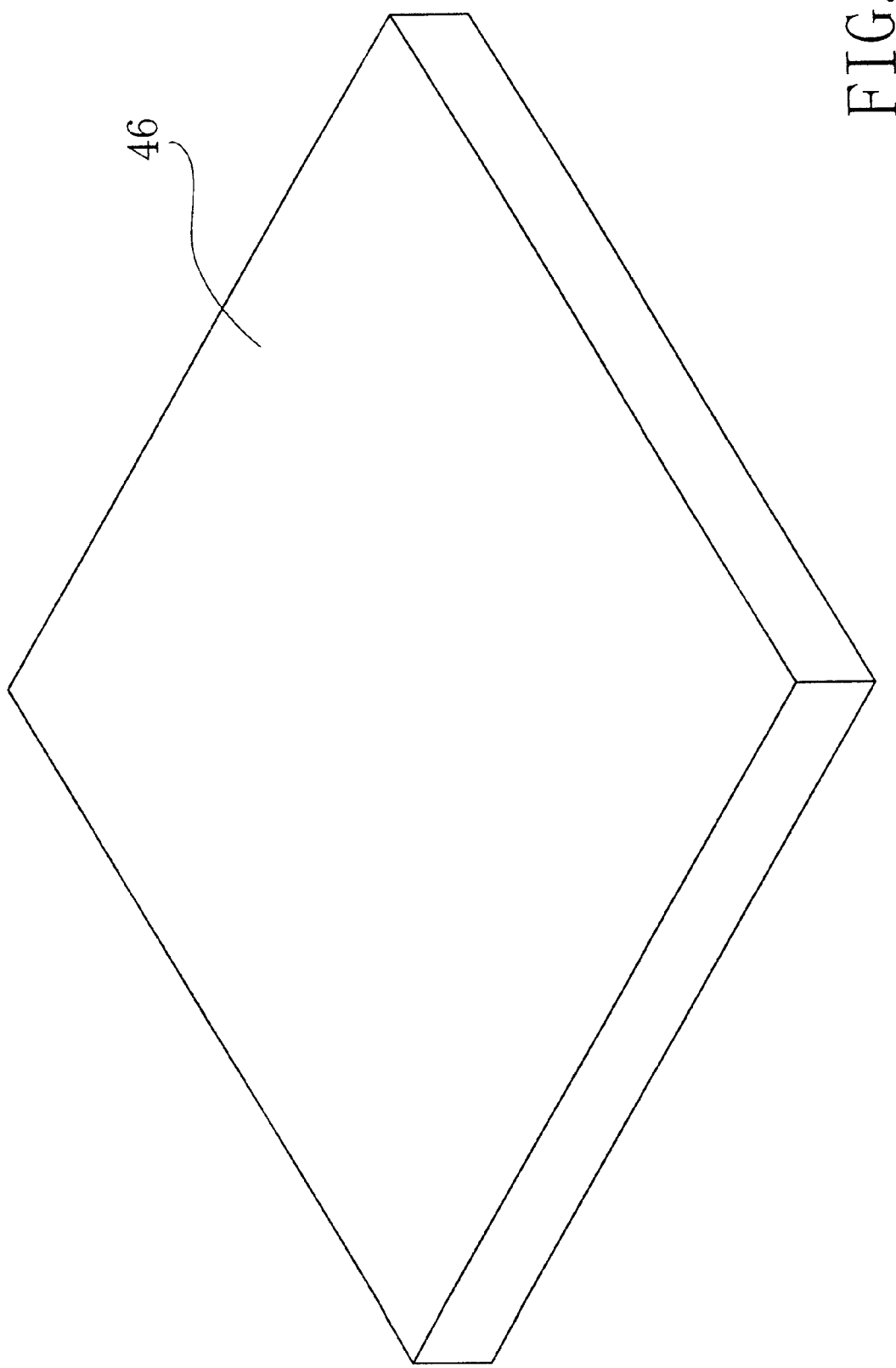
FIG. 8 is a perspective view of the terminal frame shown in FIG. 7 encapsulated in a resin.

Then, the terminal frame 40 and all of the capacitor elements 20 mounted on it are encapsulated together in epoxy resin 46 by screen printing or transfer molding, as shown in FIG. 8.

Figure 9:
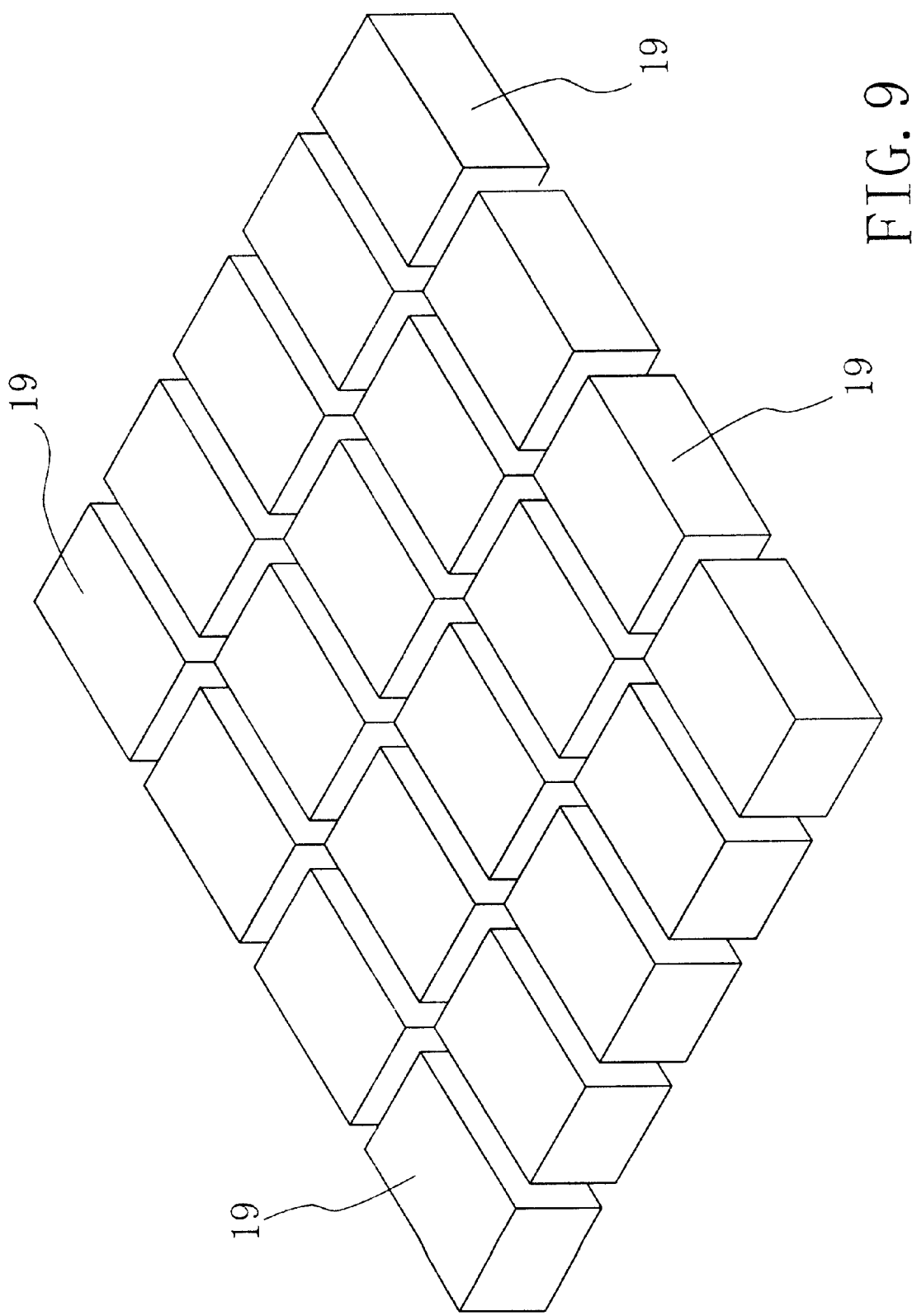
FIG. 9 is a perspective view of the encapsulated terminal frame shown in FIG. 8 after it has been severed into individual chip capacitors.

Then, the mold is cut by a dicing machine in such a manner that the respective cathode and anode terminal sections 42 and 44 can be separated from the remaining portions of the terminal frame 40, as shown in FIG. 9. In this manner, a number of tantalum chip capacitors can be fabricated simultaneously.

Various modifications may be possible to the above-described tantalum chip capacitor 19. Some of such modifications are shown in FIGS. 10–13. In FIGS. 10–13, the reference numerals same as those used in FIGS. 3A and 3B denote the same components as in FIGS. 3A and 3B, and, therefore, their detailed descriptions are not given any more.

Figure 10:
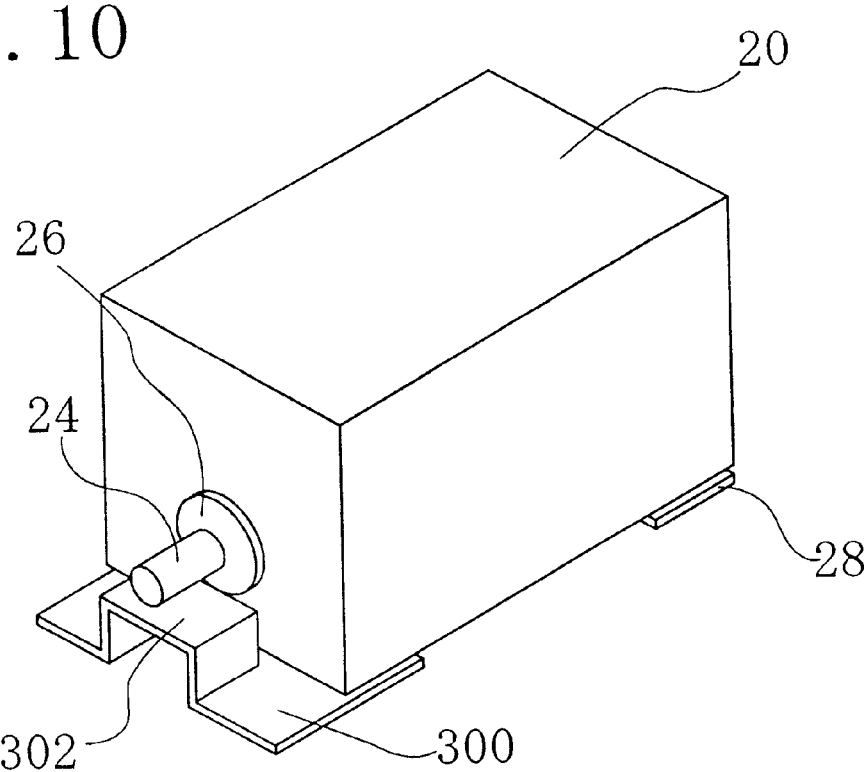
FIG. 10 is a perspective view of a first modification of the chip capacitor shown in FIGS. 3A and 3B.

As shown in FIG. 10, instead of using the tantalum wire 34 and the anode terminal 30, an anode terminal 300 may be used. The anode terminal 300 has a rise 302 in the region beneath the tantalum lead 24. The height of the rise 302 is such as to enable it to be in contact with the tantalum lead 24. The rise 302 and the lead 24 are connected by welding. The elimination of the connector 34 simplifies the fabrication of the capacitors.

Instead of using the tantalum wire 34, a connector having an upside-down-U-shaped rise similar in shape to the anode terminal 300 shown in FIG. 10 may be used with the flat anode terminal 30.

Figure 11:
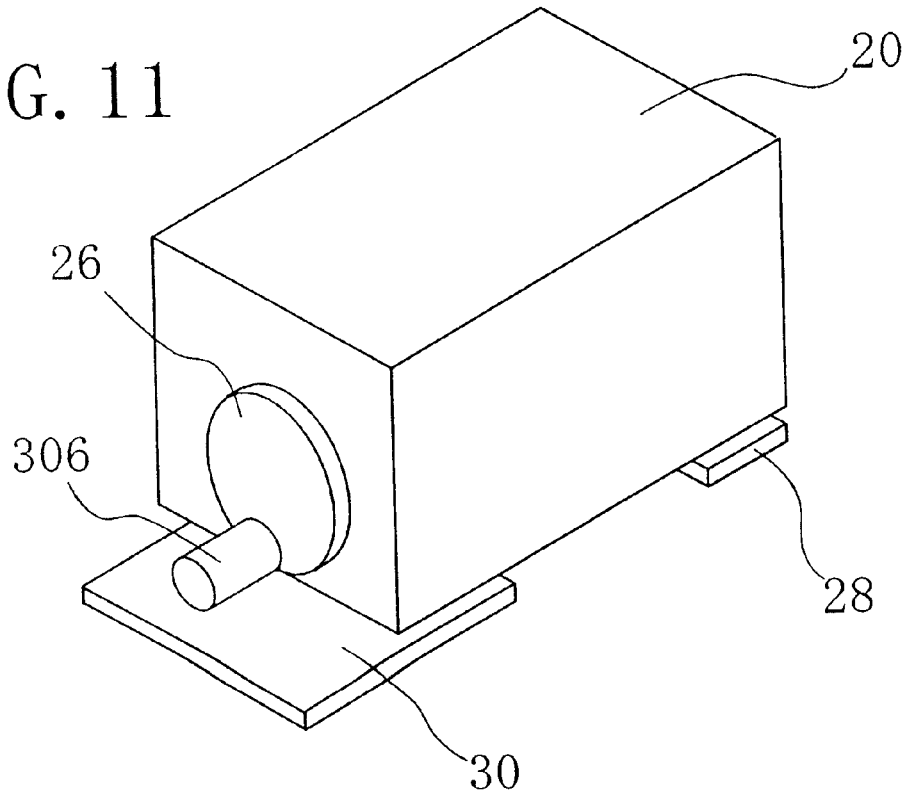
FIG. 11 is a perspective view of a second modification of the chip capacitor shown in FIGS. 3A and 3B.

As shown in FIG. 11, instead of using the tantalum lead 24, a tantalum lead 306 may be used. The lead 306 is derived from the end surface of the capacitor element 20 at a location close to the bottom surface of the capacitor element 20. The lead 306 is then coupled directly to the anode terminal 30 by welding. This configuration, free of any connector, too, simplifies the fabrication process.

Figure 12:
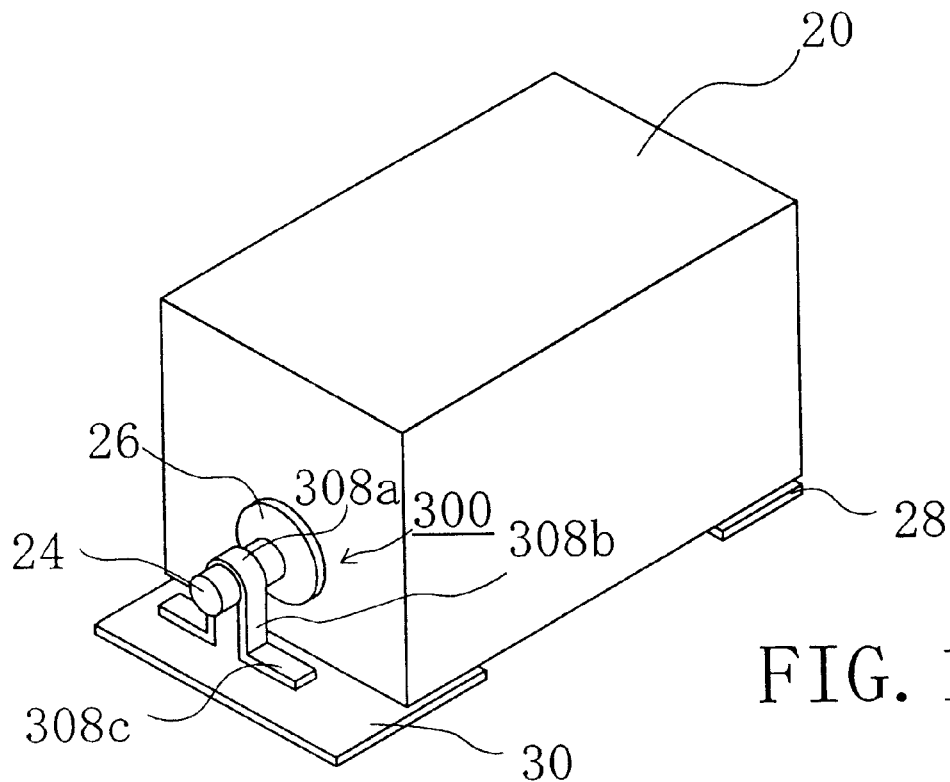
FIG. 12 is a perspective view of a third modification of the chip capacitor shown in FIGS. 3A and 3B.

Another example of modifications is shown in FIG. 12. In this example, a connector 308 is used in place of the tantalum wire 34. The connector 300 has a rounded bridge 308a adapted to contact the upper half of the tantalum lead 24, two straight legs 308b extending downward from the two ends of the bridge 308a toward the anode terminal 30, and two feet 308c which perpendicularly extend from the tip ends of the respective legs 308b in opposite directions, and are adapted to contact the anode terminal 30. The connector 308 is placed over the tantalum lead 24 from above so that the lead 24 is between the legs 308b. Thus, the mounting and positioning of the connector 308 can be done in a single step.

Figure 13:
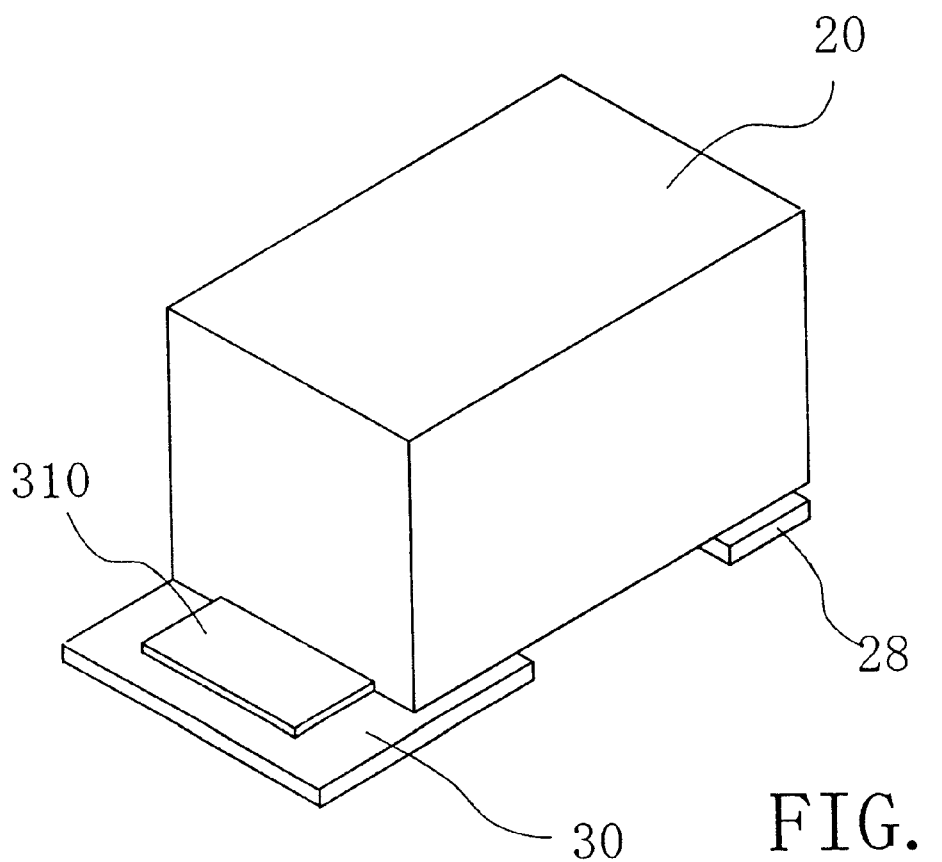
FIG. 13 is a perspective view of a fourth modification of the chip capacitor shown in FIGS. 3A and 3B.

Still another example is shown in FIG. 13. Instead of the columnar tantalum lead 24, a plate-like tantalum lead 310 may be used. The lead 310 is disposed to extend from the capacitor element 20 at a location offset toward the bottom surface of the capacitor element 20. Thus, the lead 310 is connected directly to the anode terminal 30 without the use of any connector, which simplifies the manufacturing process. Instead of using a tantalum plate as the lead 310, tantalum foil may be used.

What is claimed is:

1. A chip capacitor comprising:
   a capacitor element including a flat bottom surface, one end surface rising upward from one edge of said bottom surface, opposing other end surface rising upward from the other edge of said bottom surface, an anode lead extending outward from said one end surface, and a cathode layer deposited on said bottom surface, said cathode layer having a flat cathode bottom surface;
   a planar cathode terminal disposed beneath said flat cathode bottom surface, having opposing first and second major surfaces with said first major surface being disposed in parallel with said cathode bottom surface, a first end surface interconnecting first edges of said first and second major surfaces and an opposing second end surface interconnecting second edges of said first and second major surfaces, said first end surface being located under said flat cathode bottom surface, said second end surface being located nearer to said other end surface of said capacitor element than to said one end surface, said first major surface being electrically connected to said flat cathode bottom surface;
   a planar anode terminal disposed beneath said flat cathode bottom surface, having opposing third and fourth major surfaces, a third end surface interconnecting one edges of said third and fourth major surfaces and an opposing fourth end surface interconnecting opposing other edges of said third and fourth major surfaces, said third and fourth major surfaces lying substantially in the same planes as said first and second major surfaces, respectively, said third end surface being located nearer to said one end surface of said capacitor element than to said other end surface of said capacitor element, said fourth end surface being located under said cathode bottom surface and facing said first end surface of said cathode terminal with a spacing disposed therebetween, said anode lead being electrically connected to said third major surface; and an encapsulation coating said capacitor element, said planar anode terminal and said planar cathode terminal, leaving at least a portion of each of said second and fourth major surfaces exposed, said encapsulation coating having a bottom surface extending between said first and fourth end surfaces and lying substantially in the same plane as said second and fourth major surfaces, and end surfaces rising upward from locations in the vicinity of said second and third end surfaces.

2. The chip capacitor according to claim 1 wherein the exposed portions of said second and fourth major surfaces include portions set back toward said first and third major surfaces, respectively.

3. The chip capacitor according to claim 1 wherein said second end surface is located in the vicinity of a plane in which said other end surface of said capacitor element lies.

4. The chip capacitor according to claim 1 wherein said third end surface is located in the vicinity of a plane in which a tip end of said anode lead lies.

5. The chip capacitor according to claim 1 wherein said anode terminal has a rise which is in contact with said anode lead, said rise being electrically connected to said anode lead.

6. The chip capacitor according to claim 1 wherein said anode lead extends outward from said capacitor element at a location near said cathode bottom surface, and said anode lead is connected directly to said anode terminal.

7. The chip capacitor according to claim 1 wherein the electrical connection of said anode lead to said anode terminal is provided through a connector, said connector having a bridge-like portion contacting an upper portion of said anode lead, leg-like portions extending from two ends of said bridge-like portion toward said anode terminal, and foot-like portions provided at respective ones of lower ends of said leg-like portions, said foot-like portions contacting said anode terminal.

* * * * *